(12) United States Patent
Miyachi

(10) Patent No.: US 12,218,025 B2
(45) Date of Patent: Feb. 4, 2025

(54) ELECTRONIC DEVICE

(71) Applicant: DENSO CORPORATION, Kariya (JP)

(72) Inventor: Syuhei Miyachi, Kariya (JP)

(73) Assignee: DENSO CORPORATION, Kariya (JP)

( * ) Notice: Subject to any disclaimer, the term of this patent is extended or adjusted under 35 U.S.C. 154(b) by 420 days.

(21) Appl. No.: 17/656,158

(22) Filed: Mar. 23, 2022

(65) Prior Publication Data
US 2022/0216122 A1    Jul. 7, 2022

Related U.S. Application Data

(63) Continuation of application No. PCT/JP2020/036484, filed on Sep. 25, 2020.

(30) Foreign Application Priority Data

Sep. 27, 2019  (JP) .................................. 2019-176914

(51) Int. Cl.
| | | |
|---|---|---|
| H01L 23/367 | (2006.01) | |
| H01L 23/31 | (2006.01) | |
| H01L 23/373 | (2006.01) | |
| H01L 25/07 | (2006.01) | |
| H01L 23/29 | (2006.01) | |

(52) U.S. Cl.
CPC ...... *H01L 23/3675* (2013.01); *H01L 23/3121* (2013.01); *H01L 23/3135* (2013.01); *H01L 23/3735* (2013.01); *H01L 25/072* (2013.01); *H01L 23/295* (2013.01); *H01L 23/3736* (2013.01)

(58) Field of Classification Search
CPC .................................................. H01L 23/3675
USPC .......................................................... 257/690
See application file for complete search history.

(56) References Cited

U.S. PATENT DOCUMENTS

2009/0008771 A1 * 1/2009 Torii ................... H01L 23/3675
257/E23.101
2016/0148856 A1   5/2016 Morino

FOREIGN PATENT DOCUMENTS

| JP | 2019-029395 A | 2/2019 |
| WO | 2017/208802 A1 | 12/2017 |

* cited by examiner

*Primary Examiner* — Hsin Yi Hsieh
(74) *Attorney, Agent, or Firm* — Maschoff Brennan

(57) ABSTRACT

An electronic device includes a semiconductor device, a wiring board, a heat dissipating member, and a housing. The semiconductor device includes a semiconductor element, a conductive member electrically connected to the semiconductor element, and a resin mold sealing the semiconductor element. The wiring board includes a wiring portion on which the semiconductor device is mounted, and a resist portion disposed around the wiring portion. The heat dissipating member is in thermal contact with at least one of surfaces of the semiconductor device. The housing is in thermal contact with the semiconductor device through the heat dissipating member. Each of the resin mold and the heat dissipating member has a thermal conductivity higher than that of the resist portion.

7 Claims, 5 Drawing Sheets

ELECTRONIC DEVICE

CROSS REFERENCE TO RELATED APPLICATION

The present application is a continuation application of International Patent Application No. PCT/JP2020/036484 filed on Sep. 25, 2020, which designated the U.S. and claims the benefit of priority from Japanese Patent Application No. 2019-176914 filed on Sep. 27, 2019. The entire disclosures of all of the above applications are incorporated herein by reference.

TECHNICAL FIELD

The present disclosure relates to an electronic device including a semiconductor device in which a semiconductor element is sealed by a resin mold, a wiring board, and a housing.

BACKGROUND

An electronic device including a wiring board, a housing, and a semiconductor device in which a semiconductor element is sealed by a resin mold is known.

SUMMARY

An electronic device according to the present disclosure includes a semiconductor device including a semiconductor element, a resin mold sealing the semiconductor element, a wiring board including a wiring portion on which the semiconductor device is mounted and a resist portion disposed around the wiring portion, a heat dissipating member in thermal contact with at least one of surfaces the semiconductor device, and a housing in thermal contact with the semiconductor device through the heat dissipating member. Each of the resin mold and the heat dissipating member has a thermal conductivity higher than that of the resist portion.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

To begin with, examples of relevant techniques will be described.

The present disclosure relates to an electronic device including a semiconductor device in which a semiconductor element is sealed by a resin mold, a wiring board, and a housing.

An electronic device including a wiring board, a housing, and a semiconductor device in which a semiconductor element is sealed by a resin mold is known. In the electronic device, the semiconductor device arranged on the wiring board is covered with a heat conductive member, and the housing is in contact with the upper surface (i.e., the surface facing the wiring board) of a heat dissipating member.

The heat generated in the semiconductor element is dissipated to the housing or the wiring board. The heat of the semiconductor element is dissipated to the housing through the resin mold covering the semiconductor element and the heat dissipating member. However, heat dissipation amount to the housing is not sufficient and it is necessary to secure a sufficient heat dissipation amount to the wiring board.

In view of the above, it is an objective of the present disclosure to provide an electronic device having high heat dissipation performance with an improved heat dissipation amount to the housing.

The first electronic device according to the present disclosure includes a semiconductor device including a semiconductor element, a resin mold sealing the semiconductor element, a wiring board including a wiring portion on which the semiconductor device is mounted and a resist portion disposed around the wiring portion, a heat dissipating member in thermal contact with at least one of surfaces the semiconductor device, and a housing in thermal contact with the semiconductor device through the heat dissipating member. Each of the resin mold and the heat dissipating member has a thermal conductivity higher than that of the resist portion.

According to the first electronic device according to the present disclosure, since each of the resin mold and the heat dissipating member has higher thermal conductivity than that of the resist portion, heat conductivity in a heat dissipation path from the semiconductor element to the housing via the resin mold and the heat dissipating member is higher than that in a heat dissipation path from the semiconductor element to the wiring board through the resist portion. Therefore, it is possible to provide an electronic device having high heat dissipation performance with an improved heat dissipation amount to the housing.

First Embodiment

Figure 1:
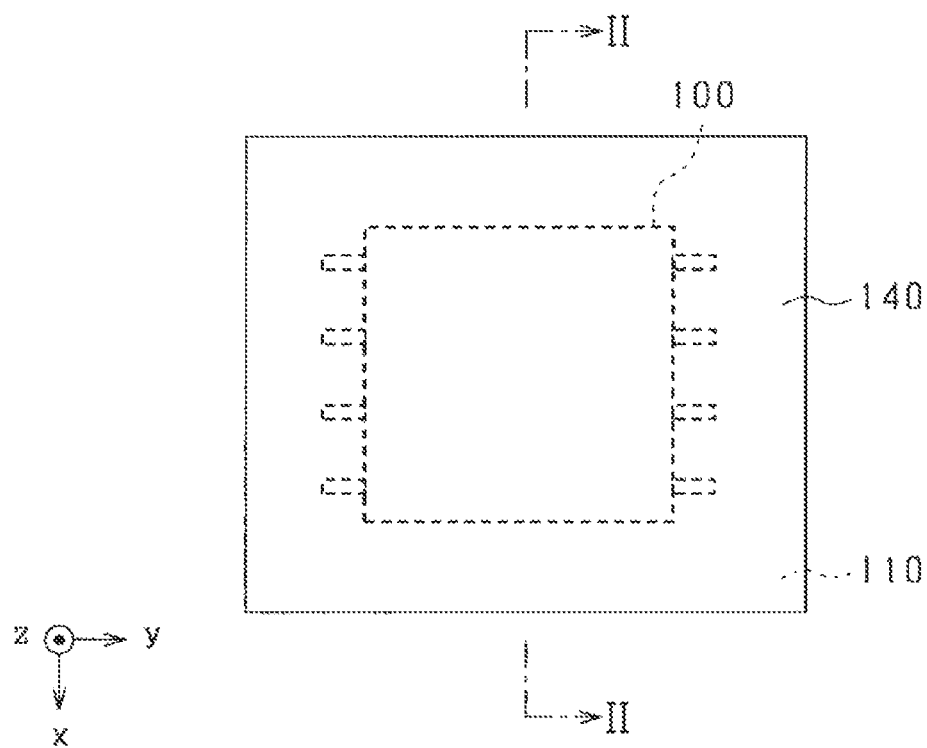
FIG. 1 is a top plan view of an electronic device according to a first embodiment.
Figure 2:
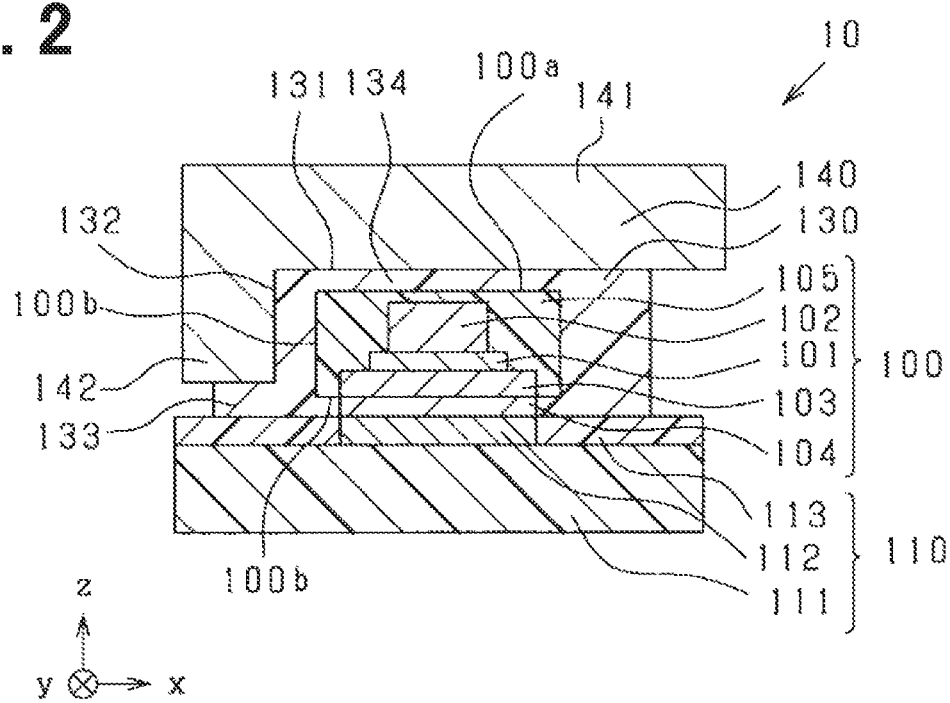
FIG. 2 is a cross-sectional view taken along a line II-II of FIG. 1.

As shown in FIGS. 1 and 2, an electronic device 10 according to a first embodiment includes a semiconductor device 100, a wiring board 110, a heat dissipating member 130, and a housing 140. The x-axis direction and the y-axis direction shown in FIGS. 1 and 2 are lateral directions of the electronic device 10 and each configuration of the electronic device 10 such as the semiconductor device 100. The xy plane direction is the plane direction of the electronic device 10 and each configuration of the electronic device 10 such as the semiconductor device 100. The z-axis direction is a vertical direction perpendicular to the plane direction.

The semiconductor device 100 includes a semiconductor element 101, a first conductive member 102 in contact with the upper surface of the semiconductor element 101, a second conductive member 103 in contact with the lower surface of the semiconductor element, a connecting member 104, a resin mold 105 sealing the semiconductor element 101.

As shown in FIG. 1, the resin mold 105 has a substantially rectangular shape in a top view and the semiconductor device 100 has an appearance in which four external terminals protrude beyond each of the side surfaces of the resin mold 105 facing in the y direction. A vertical trench gate type power MOSFET (i.e., Metal-Oxide-Semiconductor Field-Effect Transistor) is formed in the semiconductor element 101.

The first conductive member 102 on the upper surface of the semiconductor element 101 is electrically connected to the source electrode and the external terminals of the semiconductor element 101. The second conductive member 103 on the lower surface is electrically connected to the drain electrode of the semiconductor element 101 and is also electrically connected to the wiring board 110 via the connecting member 104. The first conductive member 102 is clips connected to the external terminals, but the first conductive member 102 may be a wire bonding, a wire ribbon, or the like connected to the external terminals instead of the clips. A material of the semiconductor substrate is not particularly limited, but silicon (Si), silicon carbide (SiC), gallium nitride (GaN), or the like can be exemplified.

The wiring board 110 includes a base portion 111, a wiring portion 112 on which the semiconductor device 100 is mounted, and a resist portion 113 provided around the wiring portion 112. The wiring portion 112 and the resist portion 113 are disposed on the upper surface of the base portion 111, so that a wiring pattern is formed. The connecting member 104 is provided in contact with the upper surface of the conductive wiring portion 112, and the second conductive member 103 is provided on the surface of the connecting member 104. The connecting member 104 is made of, for example, a solder material, and the semiconductor device 100 is fixed to the upper surface of the wiring portion 112 via the connecting member 104. The resist portion 113 is made of a resist resin material such as an epoxy resin.

The heat dissipating member 130 is a gel-like insulating material provided between the wiring board 110, the semiconductor device disposed on the wiring board 110, and the housing 140. The heat dissipating member 130 has a flat surface portion 134 in contact with the upper surface 100a of the semiconductor device 100 and a side surface portion 133 in contact with the side surfaces 100b of the semiconductor device 100. The lower end of the side surface portion 133 is in contact with the upper surface of the wiring board 110. The height of the heat dissipating member 130 is higher than the height of the semiconductor device 100, so that the heat dissipating member 130 covers the upper surface 100a, the entire side surfaces, and a part of the lower surface of the semiconductor device 100. The heat dissipating member 130 further covers the side surfaces of the connecting member 104 and a part of the upper surface of the wiring board 110. The height of the semiconductor device 100 is the distance between the upper surface 100a and the lower surface 100c facing the upper surface 100a. In other words, the height of the semiconductor device 100 is the height of the upper surface 100a with respect to the lower surface 100c. The height of the heat dissipating member 130 is the distance between the upper surface 131 of the flat surface portion 134 and the lower end surface of the side surface portion 133. In other words, the height of the heat dissipating member 130 is the height of the upper surface 131 relative to the lower end surface of the side surface portion 133.

The housing 140 is in thermal contact with the semiconductor device 100 via the heat dissipating member 130. The housing 140 is made of a metal such as aluminum. The housing 140 includes a flat surface portion 141 and a side surface portion 142. The side surface portion 142 protrudes downward (toward the wiring board) from the flat surface portion 141, and the height of the side surface portion 142 is higher than the height of the upper surface 100a relative to the lower surface of the semiconductor device 100. The flat surface portion 141 is provided at a position facing the upper surface 100a of the semiconductor device 100. The side surface portion 142 is provided at a position facing the side surface 100b that is not parallel with the upper surface 100a and the lower surface of the semiconductor device 100. The flat surface portion 141 is in contact with the upper surface 131 of the flat surface portion 134 of the heat dissipating member 130, and the side surface portion 142 is in contact with the outer surface of the side surface portion 133 of the heat dissipating member 130 (i.e., the surface facing in the negative direction of the x-axis shown in FIG. 2). The side surface portion 133 of the heat dissipating member 130 extends below the lower end surface of the side surface portion 142 of the housing 140, and the side surface portion 142 of the housing 140 is in thermal contact with the upper surface of the wiring board 110 (more specifically, the upper surface of the resist portion 113) via the side surface portion 133 of the heat dissipating member 130.

The resin mold 105 is made of a high heat dissipation resin material obtained by mixing a resin material such as an epoxy resin with a filler or the like for improving heat dissipation. The heat dissipating member 130 is made of a gel-like high heat dissipation material obtained by mixing a resin material, a silicon material, or the like with a filler or the like for improving heat dissipation. As the filler used for the high heat dissipation resin material and the gel-like high heat dissipation material, for example, a composite oxide material having high thermal conductivity such as alumina is selected. By adjusting the type and filling rate of the filler, the thermal conductivity of the resin mold 105 and the heat dissipating member 130 can be adjusted. The high heat dissipation resin material and the gel-like high heat dissipation material are selected so that the thermal conductivity of each of the resin mold 105 and the heat dissipating member 130 is higher than that of the resist portion 113. When the thermal conductivity of the resin mold 105 is defined as km, the thermal conductivity of the heat dissipating member 130 is defined as kg, and the thermal conductivity of the resist portion 113 is defined as kr, kr≤1 W/(m·K), km>1 W/(m·K) and kg≥3 W/(m·K) are satisfied in this embodiment. The thermal conductivity of the housing 140 made of aluminum is about 100 to 300 W/(m·K), which is remarkably high with respect to km, kg, and kr.

As described above, according to the electronic device 10 of the first embodiment, kr≤1 W/(m·K), km>1 W/(m·K), kg≥3 W/(m·K), so that each of the resin mold 105 and the heat dissipating member 130 has thermal conductivity higher than that of the resist portion 113. Therefore, the thermal conductivity in the heat dissipation path from the semiconductor element 101 to the housing 140 via the resin mold 105 and the heat dissipating member 130 is higher than that in the heat dissipation path from the semiconductor element 101 to the wiring board 110 via the resist portion 113. Therefore, it is possible to provide an electronic device 10 having a high heat dissipation performance in which the heat dissipation amount to the housing 140 is improved.

In the first embodiment, kr≤1 W/(m·K), whereas km>1 W/(m·K) and kg≥3 W/(m·K). However, the present disclosure is not limited to this. For example, while kr≤1 W/(m·K), km≥3 W/(m·K) and kg>1 W/(m·K) may be satisfied. Alternatively, while kr≤1 W/(m·K), km≥3 W/(m·K) and kg≥3 W/(m·K) may be satisfied. Further, while kr≤1 W/(m·K), km>1 W/(m·K) and kg>1 W/(m·K) may be satisfied. In order to improve the heat dissipation amount to the housing and obtain an electronic device with high heat dissipation performance, it is sufficient to satisfy km>kr and kg>kr, and it is preferable that at least one of km and kg is three times or more of kr. That is, it is preferable that one or both of km≥3 kr and kg≥3 kr are satisfied.

Further, the housing 140 is in thermal contact with the semiconductor device 100 via the heat dissipating member 130. More specifically, the flat surface portion 141 of the housing 140 facing the upper surface 100a of the semiconductor device 100 is in thermal contact with the upper surface 100a of the semiconductor device 100 via the flat surface portion 134 of the heat dissipating member 130. Therefore, heat is efficiently dissipated from the upper surface 100a of the semiconductor device 100 to the flat surface portion 141 of the housing 140 via the flat surface portion 134 of the heat dissipating member 130 having a higher thermal conductivity than the resist portion 113.

Further, the side surface portion 142 of the housing 140 facing the side surface 100b of the semiconductor device 100 is in thermal contact with the side surface 100b of the semiconductor device 100 via the side surface portion 133 of the heat dissipating member 130. Therefore, heat is efficiently dissipated from the side surface 100b of the semiconductor device 100 to the side surface portion 142 of the housing 140 via the side surface portion 133 of the heat dissipating member 130 having a higher thermal conductivity than the resist portion 113. In addition to the heat dissipation path via the flat surface portion 141 and the flat surface portion 134, the heat dissipation path via the side surface portion 142 and the side surface portion 133 is provided, so that the heat dissipation amount to the housing 140 can be further improved.

Further, the side surface portion 142 of the housing 140 can restrict the position of the heat dissipating member 130 in the lateral direction (more specifically, the x direction). Thus, the effect of restricting the heat dissipating member 130 from being offset in the lateral direction can be obtained.

Further, the side surface portion 133 of the heat dissipating member 130 is also located between the side surface portion 142 of the housing 140 and the wiring board 110. Therefore, even in the region of the semiconductor device 100 close to the wiring board 110, the thermal conductivity in the heat dissipating path to the housing 140 can be improved, which can contribute to the improvement of the heat dissipation performance of the electronic device 10.

Second Embodiment

Figure 3:
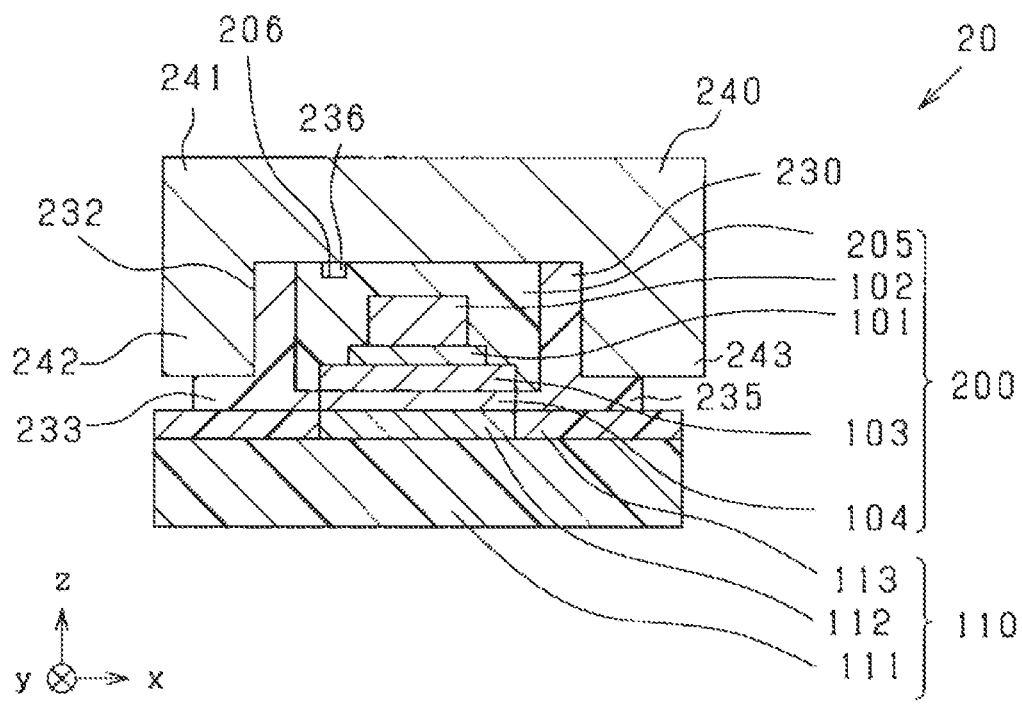
FIG. 3 is a cross-sectional view of an electronic device according to a second embodiment.

In each of the following embodiments, portions different from the embodiments having been already described will be described. As shown in FIG. 3, an electronic device 20 according to the second embodiment includes a semiconductor device 200, the wiring board 110, a heat dissipating member 230, and a housing 240. Since the wiring board 110 and the semiconductor element 101, the first conductive member 102, the second conductive member 103, and the connecting member 104 in the semiconductor device 200 are the same as those in the first embodiment, the description thereof will be omitted. The material of each component is the same as that of the first embodiment.

The semiconductor device 200 includes a resin mold 205 instead of the resin mold 105. The upper surface of the resin mold 205 has a recess 206. The recess 206 may be formed by laser printing or the like.

The heat dissipating member 230 includes side surface portions 233 and 235 and a fitting portion 236. The heat dissipating member 230 is not provided at a position on the upper surface of the semiconductor device 200 except for the recess 206. The fitting portion 236 is fit into the recess 206 of the resin mold 205.

The housing 240 includes a flat surface portion 241 and side surface portions 242 and 243. The side surface portions 242 and 243 face each other in the x-axis direction, and extend so as to sandwich the semiconductor device 200 and the heat dissipating member 230 from both sides of the semiconductor device 200 and the heat dissipating member 230 in the x-axis direction. The outer surface 232 of the heat dissipating member 230 is in contact with the side surface portion 242. Similarly, the opposite outer surface of the heat dissipating member 230 facing the side surface portion 243 is in contact with the side surface portion 243.

The flat surface portion 241 of the housing 240 is in contact with the upper surface of the semiconductor device 200, that is, the upper surface of the resin mold 205. The flat surface portion 241 is in contact with the upper end surfaces of the side surface portions 233 and 235 and the upper surface of the fitting portion 236. The side surface portions 233 and 235 extend below the lower end surfaces of the side surface portions 242 and 243, respectively. The side surface portions 242 and 243 of the housing 240 are in thermal contact with the side surfaces of the semiconductor device 200 and a part of the wiring board 110 via the side surface portions 233 and 235 of the heat dissipating member 230.

As described above, according to the second embodiment, since the flat surface portion 241 of the housing 240 is in direct contact with a part of the upper surface of the resin mold 205, heat dissipation from the upper surface of the semiconductor device 200 to the flat surface portion 241 of the housing 340 via the resin mold 205 can be promoted.

Further, the housing 240 includes the side surface portions 242 and 243 facing each other in the x-axis direction, and the heat dissipating member 230 includes the side surface portions 233 and 235 facing each other in the x-axis direction. In addition to the heat dissipation path from the side surface of the semiconductor device 200 facing in the negative direction of the x-axis to the side surface portion 242 of the housing 240 via the side surface portion 233 of the heat dissipating member 230, heat of the semiconductor device 200 is dissipated in the heat dissipation path from the side surface of the semiconductor device 200 facing in the positive direction of the x-axis to the side surface portion 243 of the housing 240 via the side surface portion 235 of the heat dissipating member 230. Therefore, the heat dissipation amount to the housing 240 can be further improved.

Further, the position of the heat dissipating member 230 can be more appropriately regulated by the side surface portions 242 and 243 facing each other in the x-axis direction, and the misalignment of the heat dissipating member 230 can be suppressed. The housing may further include one or two side surface portions facing in the y-axis direction in addition to the side surface portions 242 and 243 facing in the x-axis direction. Alternatively, the side surface portion of the housing may be configured as a continuous side surface portion surrounding the outer surface of the semiconductor device 200 and the heat dissipating member 230.

Further, according to the electronic device 20 of the second embodiment, each of the resin mold 205 and the heat dissipating member 230 has higher thermal conductivity than the resist portion 113 as in the first embodiment. Therefore, the thermal conductivity in the heat dissipation path from the semiconductor element 101 to the housing 240 via the resin mold 205 and the heat dissipating member 230 can be higher than the thermal conductivity in the heat dissipation path from the semiconductor element 101 to the wiring board via the resist portion 113. Therefore, it is possible to provide the electronic device 20 having a high heat dissipation performance in which the heat dissipation amount to the housing 240 is improved.

Third Embodiment

Figure 4:
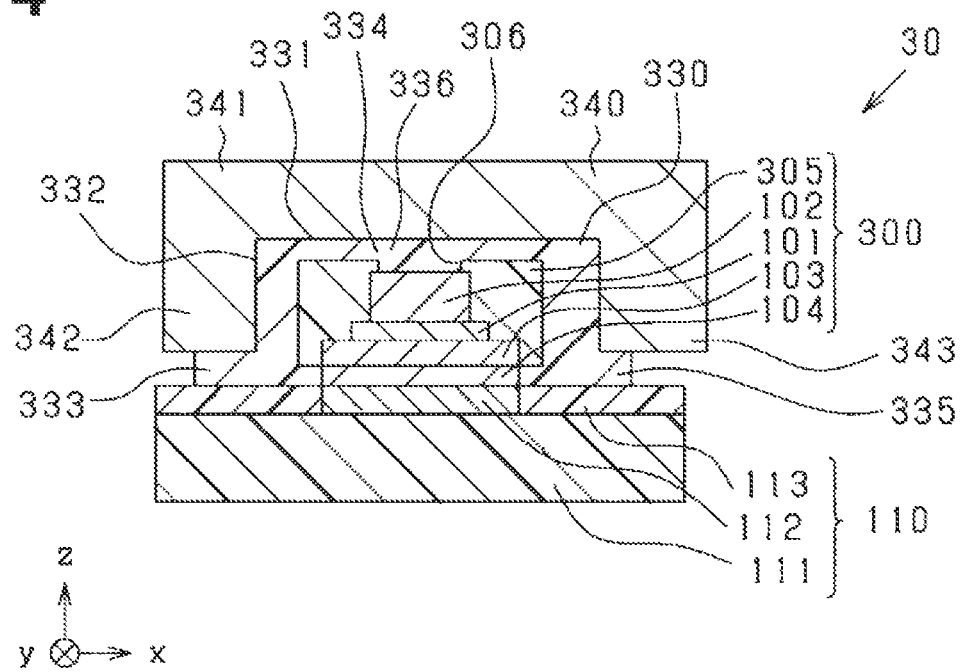
FIG. 4 is a cross-sectional view of an electronic device according to a third embodiment.

As shown in FIG. 4, the electronic device 30 according to the third embodiment includes a semiconductor device 300, the wiring board 110, a heat dissipating member 330, and a housing 340. Since the wiring board 110 and the semiconductor element 101, the first conductive member 102, the second conductive member 103, and the connecting member 104 in the semiconductor device 300 are the same as those in the first embodiment, the description thereof will be omitted. The material of each component is the same as that of the first embodiment.

The semiconductor device 300 includes a resin mold 305 instead of the resin mold 105. The upper surface of the resin mold 305 defines a recess 306 that reaches the upper surface of the first conductive member 102. That is, the first conductive member 102 has, on the upper surface, an exposed portion that is not covered with the resin mold 305.

The heat dissipating member 330 includes a flat surface portion 334, side surface portions 333 and 335, and a fitting portion 336. The flat surface portion 334 has the same thickness as the flat surface portion 134 of the first embodiment, and the fitting portion 336 protrudes downward from a part of the lower surface of the flat surface portion 334. The fitting portion 336 is fit into the recess 306 of the resin mold 305 and is in contact with the upper surface of the first conductive member 102 of the semiconductor device 300. Since the configurations of the side surface portions 333 and 335 are the same as those of the side surface portions 233 and 235 of the second embodiment, the description thereof will be omitted.

The housing 340 includes a flat surface portion 341 and side surface portions 342 and 343. Since the configuration of the housing 340 is the same as that of the housing 240 of the second embodiment, the description thereof will be omitted. The upper surface 331 of the heat dissipating member 330 is in contact with the flat surface portion 341 of the housing 340, and the outer surface 332 of the heat dissipating member 330 is in contact with the side surface portion 342. Similarly, the opposite outer surface of the heat dissipating member 330 facing the side surface portion 343 is in contact with the side surface portion 343. The flat surface portion 341 of the housing 340 is in thermal contact with the upper surface of the semiconductor device 300 via the flat surface portion 334 of the heat dissipating member 330. The side surface portions 342 and 343 of the housing 340 are in thermal contact with the side surfaces of the semiconductor device 300 and a part of the wiring board 110 via the side surface portions 333 and 335 of the heat dissipating member 330.

As described above, according to the third embodiment, the first conductive member 102 of the semiconductor device 300 has an exposed part that is not covered with the resin mold 305. The fitting portion 336 of the heat dissipating member 230 is in contact with the upper surface of the first conductive member 102 of the semiconductor device 300. Since the material of the first conductive member 102 is a metal electrode material and has a higher thermal conductivity than the resin mold 305, heat of the semiconductor device 300 is efficiently dissipated to the heat dissipating member 330 via the first conductive member 102. As a result, the heat dissipation amount to the housing 340 can be improved.

Further, according to the electronic device 30 of the third embodiment, each of the resin mold 305 and the heat dissipating member 330 has higher thermal conductivity than the resist portion 113 as in the first embodiment. Therefore, the thermal conductivity in the heat dissipation path from the semiconductor element 101 to the housing 340 via the resin mold 305 and the heat dissipating member 330 can be higher than the thermal conductivity in the heat dissipation path from the semiconductor element 101 to the wiring board via the resist portion 113. Therefore, it is possible to provide the electronic device 30 having a high heat dissipation performance in which the heat dissipation amount to the housing 340 is improved.

Further, according to the electronic device 30 of the third embodiment, as in the second embodiment, the housing 340 includes the side surface portions 342 and 343, and the heat dissipating member 330 includes the side surface portions 333 and 335. Since heat of the semiconductor device 300 is dissipated in both of the positive direction and the negative direction of the x-axis, the heat dissipation amount to the housing 340 can be further improved. Further, the position of the heat dissipating member 330 can be more appropriately regulated from both sides of the heat dissipating member 330 in the x-axis direction, and the misalignment of the heat dissipating member 330 can be suppressed.

Fourth Embodiment

Figure 5:
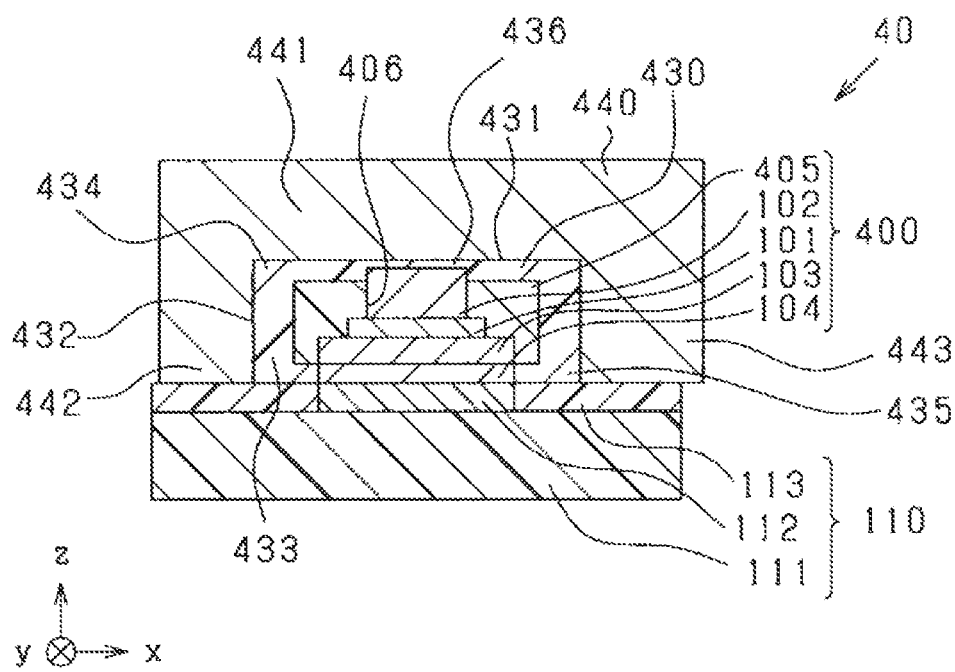
FIG. 5 is a cross-sectional view of an electronic device according a fourth embodiment.

As shown in FIG. 5, an electronic device 40 according to a fourth embodiment includes a semiconductor device 400, the wiring board 110, a heat dissipating member 430, and a housing 440. Since the wiring board 110 and the semiconductor element 101, the first conductive member 102, the second conductive member 103, and the connecting member 104 in the semiconductor device 400 are the same as those in the first embodiment, the description thereof will be omitted. The material of each component is the same as that of the first embodiment.

The semiconductor device 400 includes a resin mold 405 instead of the resin mold 105. The upper surface of the resin mold 405 has a recess 406 and the first conductive member 102 of the semiconductor device 400 passes through the recess 406 of the resin mold 405 and protrudes beyond the upper surface of the resin mold 405. In the semiconductor device 400, the upper surface of the resin mold 405 is located lower than the upper surface of the first conductive member 102.

The heat dissipating member 430 includes a flat surface portion 434, side surface portions 433, 435, and a recess 436. The flat surface portion 434 has the same thickness as the flat surface portion 134 of the first embodiment, and the lower surface of the flat surface portion 434 has the recess 436 recessed upward. Thus, the thickness of a part of the flat surface portion 434 defining the recess 436 is reduced. The upper portion of the first conductive member 102 of the semiconductor device 400 is fit into and in contact with the recess 436.

The housing 440 includes a flat surface portion 441 and side surface portions 442 and 443. The side surface portions 442 and 443 face each other in the x-axis direction, and extend to sandwich the semiconductor device 400 and the heat dissipating member 430 from both sides of the semiconductor device 400 and the heat dissipating member 430 in the x-axis direction. The lower end surfaces of the side surface portions 442 and 443 extend to be in contact with the upper surface of the wiring board 110. The side surface portions 433 and 435 of the heat dissipating member 430 do not extend below the lower end surfaces of the side surface portions 442 and 443 of the housing 440.

The upper surface 431 of the heat dissipating member 430 is in contact with the flat surface portion 441 of the housing 440, and the outer surface 432 of the heat dissipating member 430 is in contact with the side surface portion 442 of the housing 440. Similarly, the opposite outer surface of the heat dissipating member 430 facing the side surface portion 443 is in contact with the side surface portion 443 of the housing 440. The flat surface portion 441 of the housing 440 is in thermal contact with the upper surface of the semiconductor device 400 via the flat surface portion 434 of the heat dissipating member 430. The side surface portions 442 and 443 of the housing 440 are in thermal contact with the side surfaces of the semiconductor device 400 via the side surface portions 433 and 435 of the heat dissipating member 430. The side surface portions 442 and 443 of the housing 440 are further in direct contact with a part of the wiring board 110.

As described above, according to the fourth embodiment, the first conductive member 102 of the semiconductor device 400 protrudes beyond the resin mold 405. The flat surface portion 441 of the housing 440 is in thermal contact with the upper surface of the first conductive member 102 of the semiconductor device 400 via a part of the heat dissipating member 430 defining the recess 436 and having a relatively thin thickness. Since the material of the first conductive member 102 is a metal electrode material and has a higher thermal conductivity than the resin mold 405, heat of the semiconductor device 400 can be efficiently dissipated to the heat dissipating member 430 via the first conductive member 102. Further, since a part of the heat dissipating member 430 defining the recess 436 has a relatively thin thickness and the heat dissipation path from the upper surface of the semiconductor device 400 to the flat surface portion 441 of the housing 440 is shortened, heat dissipation to the housing 440 can be further promoted.

In the semiconductor device 400, it is preferable that the upper surface of the first conductive member 102 is insulated by insulating plating or the like. By insulating the upper surface of the first conductive member 102, the thickness of a part of the heat dissipating member 430 defining the recess 436 can be further thinned.

Further, the height of each of the side surface portions 442 and 443 protruding from the flat surface portion 441 of the housing 440 (more specifically, the height from the lower surface of the flat surface portion 441 to the lower end surface of each of the side surface portions 442 and 443) is higher than the height of the upper surface of the semiconductor device 300 relative to the lower surface of the semiconductor device 300. The housing 440 is configured to be in direct contact with the wiring board 110. Therefore, heat dissipated to the resist portion 113 can also be dissipated to the housing 440, and it is possible to provide the electronic device 40 having a higher heat dissipation performance with a further improved heat dissipation amount to the housing 440.

Modifications

Figure 6:
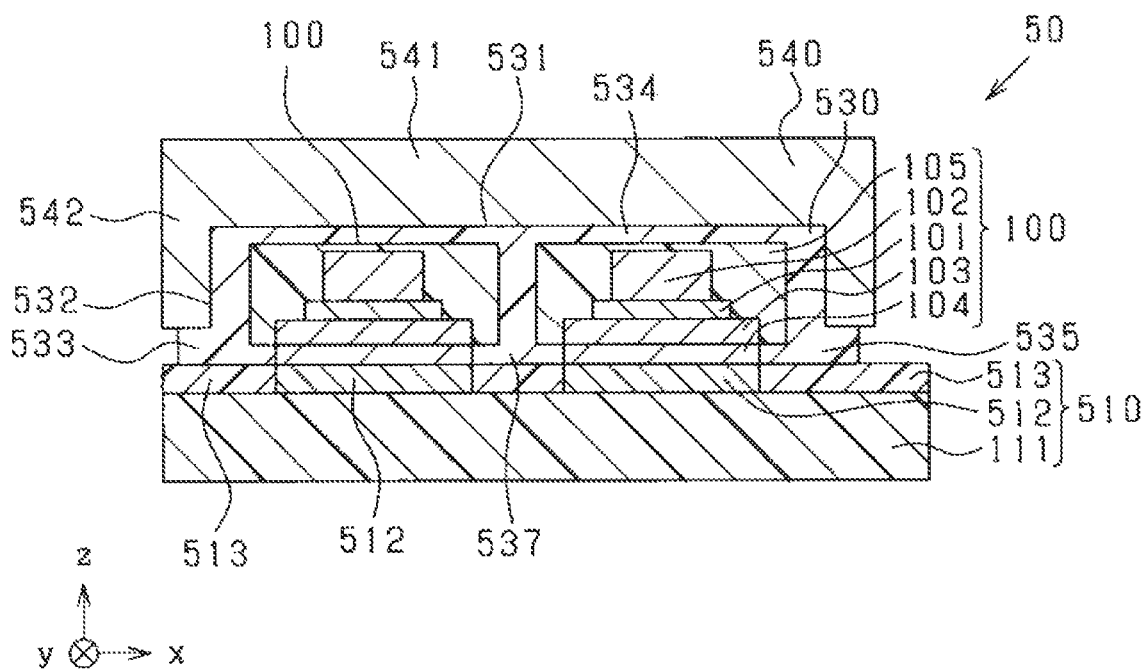
FIG. 6 is a cross-sectional view of an electronic device according to a modified example.
Figure 7:
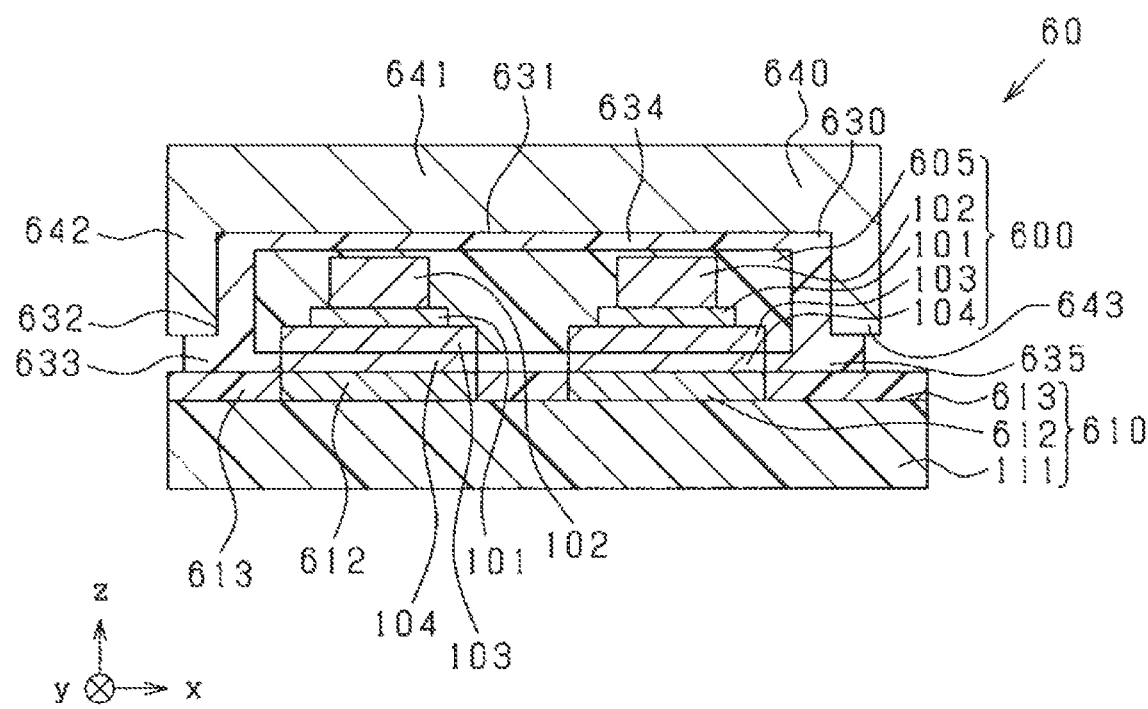
FIG. 7 is a cross-sectional view of an electronic device according to a modified example.

In each of the above embodiments, an electronic device including only one semiconductor device has been described as an example, but the present disclosure is not limited thereto. The number of semiconductor devices included in the electronic device may be two as shown in FIG. 6 or three or more. Further, although an example in which the semiconductor device including only one semiconductor element is described, the present disclosure is not limited thereto. The number of semiconductor elements included in one semiconductor device integrated by the resin mold may be two as shown in FIG. 7 or three or more.

In the electronic device 50 shown in FIG. 6, two semiconductor devices 100 having a similar structure are arranged on the wiring board 510 side by side in the x direction. The wiring board 510 has two wiring portions 512 on which the two semiconductor devices 100 are arranged respectively and the resist portion 513 is disposed around the two wiring portions 512.

The heat dissipating member 530 includes a flat surface portion 534, side surface portions 533 and 535, and an intermediate portion 537. The flat surface portion 534 is provided over the upper surfaces of the two semiconductor devices 100. The side surface portions 533 and 535 and the intermediate portion 537 extend downward from the flat surface portion 534 to be in contact with the surface of the wiring board 510. The intermediate portion 537 is interposed between the two semiconductor devices 100.

The housing 540 includes a flat surface portion 541 and side surface portions 542 and 543. The side surface portions 542 and 543 face each other in the x-axis direction, and extend to sandwich the two semiconductor devices 100 and the heat dissipating member 530 from both sides of the two semiconductor devices 100 and the heat dissipating member 530 in the x-axis direction.

The upper surface 531 of the heat dissipating member 530 is in contact with the flat surface portion 541 of the housing 540. The outer side surface 532 of the heat dissipating member 530 is in contact with the side surface portion 542 of the housing 540. Similarly, the opposite outer side surface of the heat dissipating member 530 facing the side surface portion 543 of the housing 540 is in contact with the side surface portion 543. The flat surface portion 541 of the housing 540 is in thermal contact with the upper surfaces of the two semiconductor devices 100 via the flat surface portion 534 of the heat dissipating member 530. The side surface portions 533 and 535 extend below the lower end surfaces of the side surface portions 542 and 543, respectively. The side surface portion 542 of the housing 540 is in thermal contact with the left side surface of the left semiconductor device 100 that is arranged on the left side in the figure (i.e., the negative direction side of the x-axis) and a part of the wiring board 110 via the side surface portion 533 of the heat dissipating member 530. The side surface portion 543 of the housing 540 is in thermal contact with the right side surface of the right semiconductor device 100 that is arranged on the right side in the figure (i.e., the positive direction side of the x-axis) and a part of the wiring board 110 via the side surface portion 535 of the heat dissipating member 530. The intermediate portion 537 is in contact with the right side surface of the left semiconductor device 100 and the left side surface of the right semiconductor device 100.

The electronic device 60 shown in FIG. 7 is different from the electronic device 50 shown in FIG. 6 in that the electronic device 60 includes an integral semiconductor device 600 in which two sets of the semiconductor element 101, the first conductive member 102, the second conductive member 103, and the connecting member 104 having the same configurations as those in the semiconductor device 100 are arranged side by side in the x direction and integrated by one resin mold 605.

The heat dissipating member 630 includes a flat surface portion 634 and side surface portions 633 and 635. The flat surface portion 534 is provided over the upper surfaces of the two semiconductor devices 600. Since other configurations of the electronic device 60 are the same as those of the electronic device 50 shown in FIG. 6, the description will be omitted by replacing the reference numbers in the 500 series in FIG. 6 with those in the 600 series.

Fifth Embodiment

Figure 8:
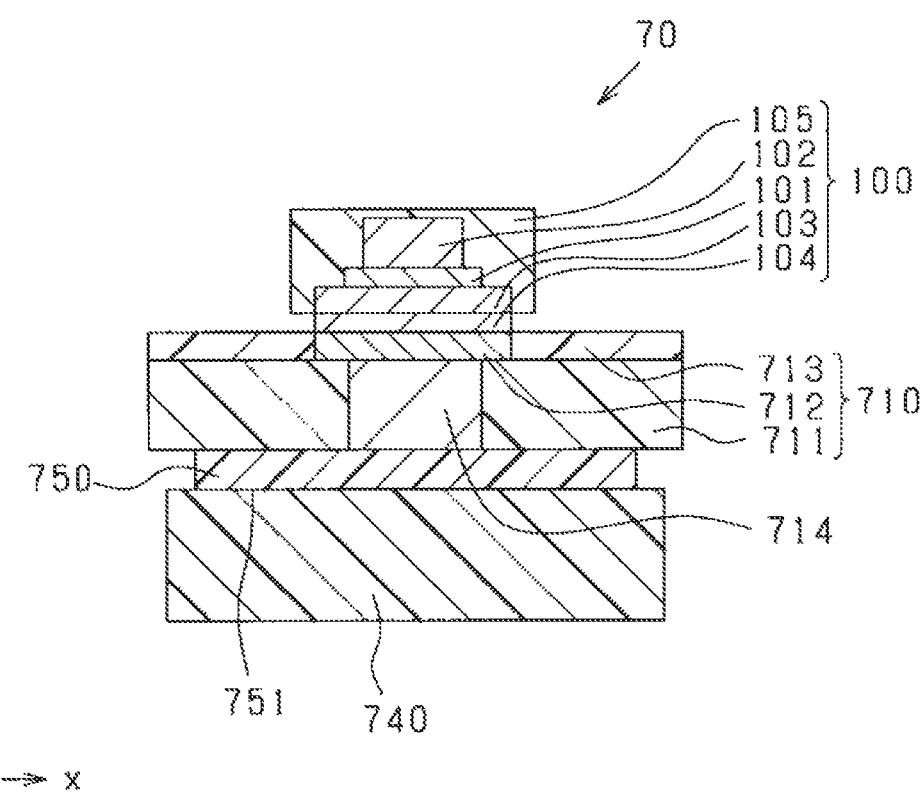
FIG. 8 is a cross-sectional view of an electronic device according to a fifth embodiment.

In each of the above embodiments, an example where the housing is provided at a position facing the wiring board through the semiconductor device has been described. However, as shown in FIG. 8 and the like, the housing may be disposed on the side of the semiconductor device on which the wiring board is arranged. For example, the housing may be provided at a position facing the semiconductor device through the wiring board.

The electronic device 70 according to the fifth embodiment includes the semiconductor device 100, a wiring board 710, a heat dissipating member 750, and a housing 740. Since the semiconductor device 100 is the same as that of the first embodiment, the description thereof will be omitted. The material of each component is the same as that of the first embodiment.

The wiring board 710 includes a base portion 711, a wiring portion 712, a resist portion 713, and a penetrating portion 714. The penetrating portion 714 penetrates the base portion 711 in the vertical direction. The wiring portion 712 is provided at a position on the upper surface of the penetrating portion 714 and is in contact with the penetrating portion 714. As the material of the penetrating portion 714, a material having a higher thermal conductivity than that of each of the base portion 711 and the resist portion 713 can be preferably used. In the present embodiment, as the penetrating portion 714, the same or similar conductive material as that of the wiring portion 712 (for example, a metal material containing copper and aluminum or a composite metal material) is used.

The heat dissipating member 750 is in contact with the lower surface of the wiring board 710. The heat dissipating member 750 is provided at a position in contact with at least the lower surface of the penetrating portion 714. That is, the heat dissipating member 750 has a first surface facing the semiconductor device 100 and being in contact with the wiring board 710. Similar to the first embodiment, the heat dissipating member 750 is made of an insulating gel-like high heat dissipating material mixed with a filler or the like for improving heat dissipation performance. When the thermal conductivity of the resin mold 105 is defined as km, the thermal conductivity of the heat dissipating member 750 is defined kg, and the thermal conductivity of the resist portion 713 is defined kr, $kr \leq 1$ W/(m·K), $km > 1$ W/(m·K) and $kg \geq 3$ W/(m·K) are satisfied in this embodiment. The thermal conductivity of each of the penetrating portion 714 and the wiring portion 712 is about 100 to 400 W/(m·K), which is remarkably high with respect to kr and kg.

The housing 740 is provided at a position in contact with the lower surface of the heat dissipating member 750. The housing 740 has a flat plate shape substantially parallel to the lower surface of the semiconductor device 100 and the lower surface of the wiring board 710. The housing 740 is in thermal contact with the lower surface of the semiconductor device 100 via the heat dissipating member 750, the penetrating portion 714, and the wiring portion 712. The thermal conductivity of the housing 140 that is made of aluminum falls within a range of 100 to 300 W/(m·K), which is remarkably high with respect to kg and kr.

As described above, according to the electronic device 70 of the fifth embodiment, heat of the semiconductor device 100 is dissipated to the housing 740 through the wiring portion 712, the penetrating portion 714, and the heat dissipating member 750 that are arranged below the semiconductor device 100 (i.e., on the negative side of the semiconductor device 100 in the z-axis direction) in this order. In this heat dissipation path, heat is dissipated to the housing 740 via the wiring portion 712 and the penetrating portion 714 each of which has a thermal conductivity as high as that of the housing 740 and via the heat dissipating member 750 that has a thermal conductivity higher than that of the resist portion 713. Thus, heat conductivity in this heat dissipation path is higher than that in a heat dissipation path from the semiconductor element 101 to the base portion 711 of the wiring board 710 through the resist portion 713. Therefore, it is possible to provide the electronic device 70 having a high heat dissipation performance in which the heat dissipation amount to the housing 740 is improved. In the electronic device 70, since the high heat dissipation resin material is used for the resin mold 105 as in the first embodiment, heat dissipation of the semiconductor device 100 via the resin mold 105 is also promoted.

Modifications

Figure 9:
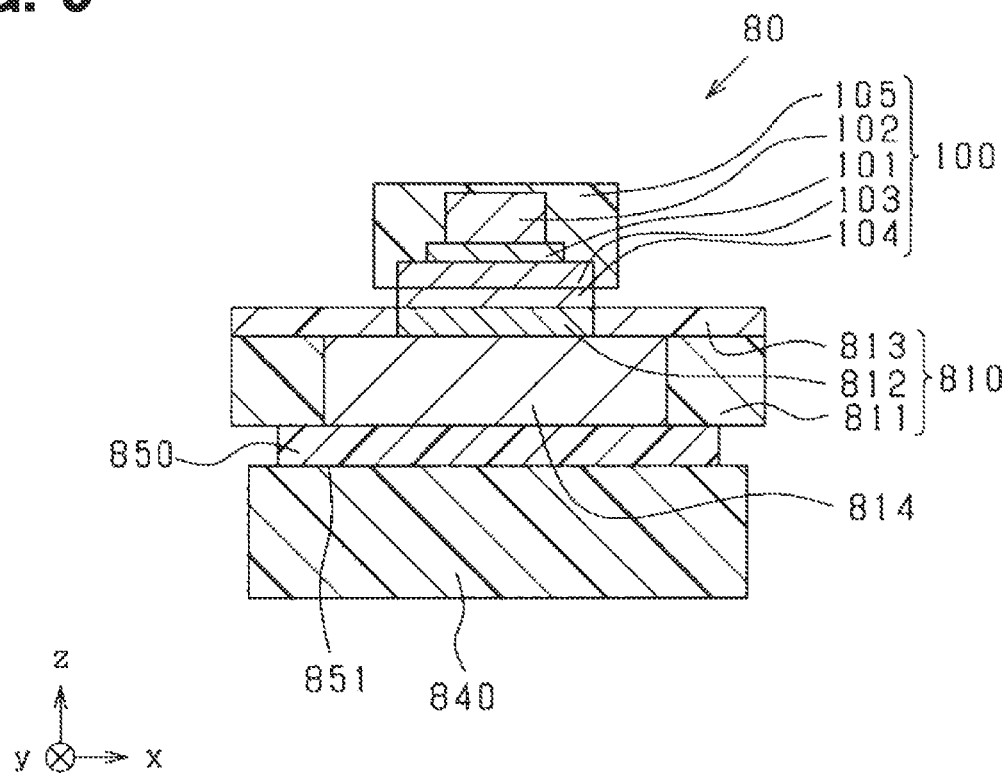
FIG. 9 is a cross-sectional view of an electronic device according to a modified example.

As in an electronic device 80 shown in FIG. 9, the penetrating portion 814 may be larger than the wiring portion 812. By increasing the dimension of the penetrating portion 814 in the plane direction (i.e., the x-axis direction or y-axis direction), the heat transfer area of the heat dissipation path becomes large, so that heat can be dissipated more efficiently. Since the other configurations of the electronic device 80 are the same as those of the electronic device 70 shown in FIG. 8, the description will be omitted by replacing the reference numbers in the 700 series in FIG. 8 with those in the 800 series.

Figure 10:
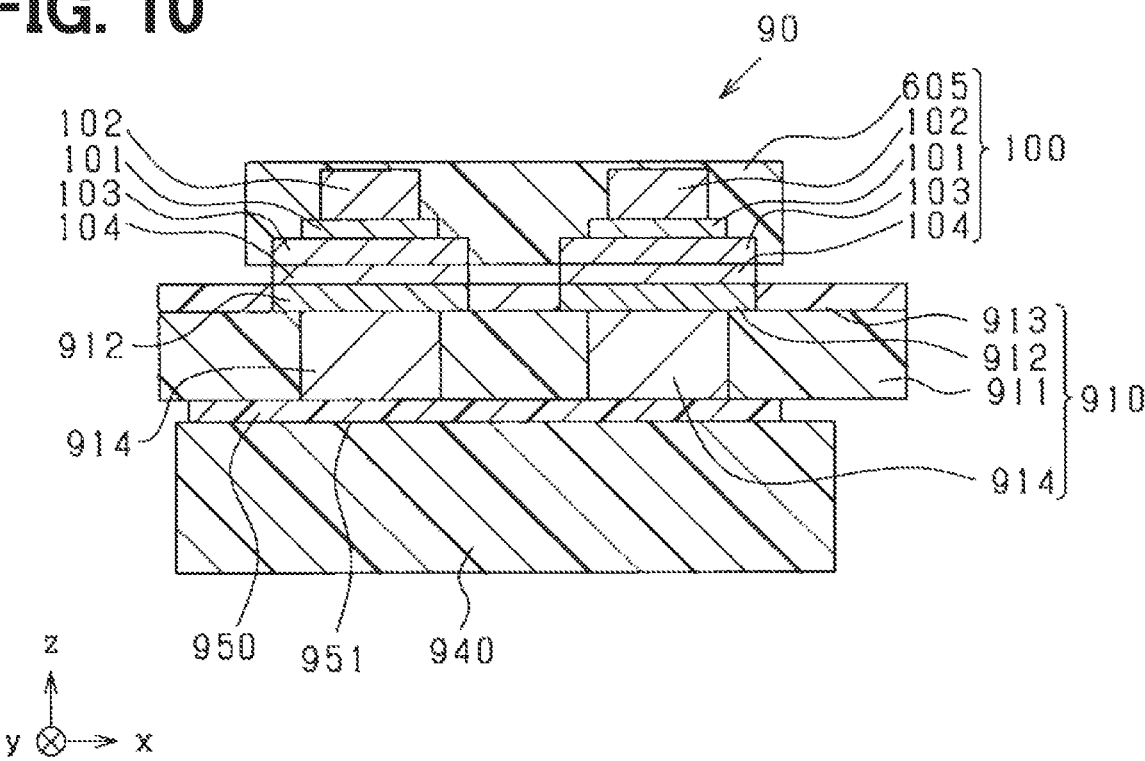
FIG. 10 is a cross-sectional view of an electronic device according to a modified example.

In FIGS. 8 and 9, the description is made by exemplifying the semiconductor device including only one semiconductor element, but the present disclosure is not limited thereto. The number of semiconductor elements included in one semiconductor device integrated by the resin mold may be two as shown in FIG. 10 or three or more. Further, the number of semiconductor devices included in the electronic device may be two or more.

The electronic device 90 shown in FIG. 10 includes an integral semiconductor device 900 in which two sets of the semiconductor element 101, the first conductive member 102, the second conductive member 103, and the connecting member 104 that have the same configurations as those of the semiconductor device 100 are arranged on the wiring board 910 side by side in the x direction and integrated by one resin mold 905. The wiring board 910 has two wiring portions 912 on which the two semiconductor elements are respectively arranged, and two penetrating portions 914 in contact with the lower surfaces of the two wiring portions 912, respectively. A resist portion 913 is disposed around the wiring portions 912. Since the other configurations of the electronic device 90 are the same as those of the electronic device 70 shown in FIG. 8, the description thereof will be omitted by replacing the reference number in the 700 series in FIG. 8 with the 900 series.

According to the embodiments described above, the following effects can be obtained.

The first electronic devices 10, 20, 30, 40, 50, 60 have a semiconductor device (for example, a semiconductor device 100), a wiring board (for example, a wiring board 110), and a heat dissipating member (for example, a heat dissipating member 130), and a housing (for example, a housing 140). The semiconductor device 100 includes a semiconductor element 101, a conductive member (the first conductive member 102) electrically connected to the semiconductor element 101, and a resin mold 105 sealing the semiconductor element 101. The wiring board 110 includes a base portion 111, a wiring portion 112 on which the semiconductor device 100 is mounted, and a resist portion 113 provided around the wiring portion 112. The heat dissipating member 130 is in contact with at least one of surfaces of the semiconductor device 100. The housing 140 is in thermal contact with the semiconductor device 100 via the heat dissipating member 130. The thermal conductivity km of the resin mold 105 and the thermal conductivity kg of the heat dissipating member 130 are higher than the thermal conductivity kr of the resist portion 113 (i.e., km>kr and kg>kr).

According to the first electronic device, since each of the resin mold 105 and the heat dissipating member 130 has a higher thermal conductivity than the resist portion 113, the thermal conductivity in the heat dissipation path from the semiconductor element 101 to the housing 140 via the resin mold 105 and the heat dissipating member 130 is higher than the thermal conductivity in the heat dissipation path from the semiconductor element 101 to the wiring board 110 via the resist portion 113. Therefore, it is possible to provide an electronic device having high heat dissipation performance with an improved heat dissipation amount to the housing 140.

Like the first electronic device 20, at least a part of the resin mold 205 may be in contact with the housing 240. By dissipating heat directly from the resin mold 205 to the housing 240, the heat dissipation from the semiconductor device 200 is promoted.

Like the first electronic device 10, 20, 30, 40, 50, 60, the housing has a flat surface portion provided at a position facing the upper surface or the lower surface of the semiconductor device and a side surface portion provided at a position facing at least one of the side surfaces of the semiconductor device that are not parallel with the first surface. The side surface portion increases the heat dissipation path from the semiconductor device to the housing, and further promotes heat dissipation. Further, the side surface portion can restrict the position of the heat dissipating member from being offset.

Like the first electronic device 40, the height of the side surface portion protruding from the flat surface portion of the housing is preferably higher than the height of the upper surface of the semiconductor device relative to the lower surface of the semiconductor device, and the lower end surface of the side surface portion is preferably in contact with the wiring board. Thereby, the heat dissipated to the resist portion can also be dissipated to the housing, and it is possible to provide an electronic device having a higher heat dissipation amount with a further improved heat dissipation amount to the housing.

As in the first electronic device 10, 20, 30, 50, 60, the heat dissipating member may be provided between the side surface portion of the housing and the wiring board. Thereby, even in a region of the semiconductor device close to the wiring board, the thermal conductivity in the heat dissipation path to the housing can be improved, which can contribute to the improvement of the heat dissipation performance of the electronic device.

The conductive member may have an exposed part that is not covered with the resin mold as in the first electronic devices 30 and 40. Since the material of the conductive member is a metal electrode material that has a higher thermal conductivity than the resin mold, heat of the semiconductor device can efficiently dissipate to the heat dissipating member via the conductive member, which improves heat dissipation amount to the housing. Further, it is preferable that the surface of the exposed part of the conductive member is insulated by insulating plating. Thereby, the thickness of the heat dissipating member disposed between the surface of the exposed part and the housing can be thinned, which can contribute to the improvement of the heat dissipating performance of the electronic device.

Further, like the second electronic devices 70, 80, 90, in the electronic device including the semiconductor device 100, the wiring board 710, 810, 910 including the base portion 711, 811, 911, the penetrating portion 714, 814, 914 penetrating the base portion 711, 811, 911, the wiring portion 712, 812, 912 that is disposed on the upper surface of the penetrating portion 714, 814, 914 and that the semiconductor device 100 is mounted on, the resist portion 713, 813, 913 disposed around the wiring portion 712, 812, 912, the heat dissipating member 750, 850, 950 in contact with the wiring board 710, 810, 910 on a side of the heat dissipating member 750, 850, 950 facing the wiring portion 712, 812, 912 and the penetrating portion 714, 814, 914, and a housing 740, 840, 940 in thermal contact with the semiconductor device 100 via the heat dissipating member 750, 850, 950, heat dissipation performance of the electronic device can be improved by setting the thermal conductivity of each of the penetrating portion 714, 814, 914 and the heat dissipating member 750, 850, 950 to higher than that of the resist portion 713, 813, 913. Specifically, the thermal conductivity in the heat dissipation path from the semiconductor element to the housing via the penetrating portion and the heat dissipating member is higher than the thermal conductivity in the heat dissipation path from the semiconductor element to the base portion via the resist portion. Therefore, it is possible to provide an electronic device having high heat dissipation performance with an improved heat dissipation amount to the housing.

While the present disclosure has been described in accordance with the embodiment, it is understood that the present disclosure is not limited to such embodiments or structures. The present disclosure encompasses various modifications and variations within the scope of equivalents. In addition, while the various combinations and configurations, which are preferred, other combinations and configurations, including more, less or only a single element, are also within the spirit and scope of the present disclosure.

What is claimed is:

1. An electronic device, comprising:
   a semiconductor device including:
      a semiconductor element;
      a conductive member electrically connected to the semiconductor element; and
      a resin mold sealing the semiconductor element;
   a wiring board including:
      a wiring portion on which the semiconductor device is mounted; and
      a resist portion disposed around the wiring portion;
   a heat dissipating member in thermal contact with at least one of surfaces of the semiconductor device; and a housing in thermal contact with the semiconductor device through the heat dissipating member, wherein each of the resin mold and the heat dissipating member has a thermal conductivity higher than that of the resist portion.

2. The electronic device according to claim 1, wherein at least a part of the resin mold is in contact with the housing.

3. The electronic device according to claim 1, wherein the housing includes:
   - a flat surface portion disposed at a position facing an upper surface or a lower surface of the semiconductor device; and
   - a side surface portion disposed at a position facing at least one of side surfaces of the semiconductor device that are not parallel with the upper surface and the lower surface.

4. The electronic device according to claim 3, wherein the side surface portion protrudes from the flat surface portion, and a height of the side surface portion is higher than a height of the semiconductor device between the upper surface and the lower surface.

5. The electronic device according to claim 1, wherein the heat dissipating member is disposed between a side surface portion of the housing and the wiring board.

6. The electronic device according to claim 1, wherein the conductive member has an exposed part that is not covered with the resin mold.

7. The electronic device according to claim 6, wherein a surface of the exposed part of the conductive member is insulated by insulation plating.

* * * * *